(12) United States Patent
Beat

(10) Patent No.: US 6,456,118 B2
(45) Date of Patent: Sep. 24, 2002

(54) DECODER CIRCUIT

(75) Inventor: Robert Beat, Bristol (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/759,832

(22) Filed: Jan. 12, 2001

(51) Int. Cl.[7] .............................................. G11C 8/00
(52) U.S. Cl. ........................ 326/105; 326/105; 326/95
(58) Field of Search ........................... 326/95–98, 105, 326/106, 108, 112, 119, 121

(56) References Cited

U.S. PATENT DOCUMENTS

| | | | | |
|---|---|---|---|---|
| 4,063,118 A | * | 12/1977 | Nishimura | 307/270 |
| 5,737,270 A | * | 4/1998 | Oppold et al. | 365/203 |
| 5,804,989 A | | 9/1998 | Sato | 326/108 |
| 6,081,136 A | * | 6/2000 | Khanna et al. | 326/95 |

* cited by examiner

*Primary Examiner*—Michael Tokar
*Assistant Examiner*—Anh Tran

(74) *Attorney, Agent, or Firm*—Darby & Darby

(57) ABSTRACT

A decode circuit for selecting one of a plurality of output lines in dependence on the status of a plurality of input lines, the circuit comprising: a first decode arrangement comprising: a first decode node; first precharging circuitry for charging the first decode node to a charging potential; first discharging circuitry comprising a plurality of switching means each operable in dependence on the status of a respective one of the input lines to couple the first decode node to a discharging potential, and first selection circuitry coupled to a respective one of the output lines and operable in response to a first enable signal to select that output line if the first decode node has not discharged; and a second decode arrangement comprising: a second decode node; second precharging circuitry for charging the second decode node to a charging potential; second discharging circuitry comprising a plurality of switching means each operable in dependence on the status of a respective one of the input lines to couple the second decode node to a discharging potential; and second selection circuitry coupled to a respective one of the output lines and operable in response to a second enable signal to select that output line if the second discharge node has not discharged; wherein the first enable signal is derived from the potential of the second decode node.

17 Claims, 4 Drawing Sheets

DECODER CIRCUIT

BACKGROUND OF THE INVENTION

1. Field of the Invention

This invention relates to a decoder circuit, for example for use in memory addressing.

2. Description of the Related Art

FIG. 1 shows an example of the structure of a static random access memory (SRAM) and its addressing circuitry. The memory 1 comprises a grid of memory cells 2 arranged in rows and columns. In this example there are four rows and four columns but typical SRAMs have many more rows and columns. All the cells in a row are connected to a single wordline 3. All the cells in a column are connected to a single bitline 4. Each cell has two stable states, representing high and low output values. When one of the wordlines is activated each bitline takes on the state of the cell to which that bitline is connected and which is also connected to the activated wordline. The bitlines are connected to a multiplexer 5 which allows a single one of the bitlines to be selected to provide the final output from the memory at 6.

Each cell in the memory is allotted a number. To access a cell in the memory the cell's number is applied in binary format to input lines 7. A decoder 8 takes some of the lines 7 (indicated at 9) as input and thereby determines which one of the wordlines should be activated to access the cell. The remainder of the lines 7 (indicated at 10) pass to the multiplexer 5, which thereby determines which of the bitlines should be selected so that the final output at 6 takes on the state of the desired cell.

FIG. 2 shows one example of a structure for decoder 8. The lines 9 each branch through an inverter 10 so that address signals representing inverted (indicated at 11) and non-inverted (indicated at 12) versions of each of the lines 9 are available. The appropriate inverted or non-inverted version of each of the lines 9 is applied to a NAND gate 13 corresponding to each wordline. The output of each NAND gate passes to an inverter 14 which drives the respective wordline.

By means of the correct set of connections to each of the NAND gates a wordline is activated only when the appropriate set of inputs is applied at 9. This circuit is simple, but has a number of disadvantages if the number of address line inputs is increased.

1. In many important applications—for example in the caches of high-speed processors—speed of access to the desired memory cell is crucial. However, the large NAND gates are relatively slow.
2. In almost all applications—and especially in battery-powered applications—power consumption is very important. However, in the system of FIG. 2 as the input lines 9 change values potentially many, or all, of the distributed address signals will change, giving rise to a high current consumption. The current consumption is further increased by the need to generate an inverted version of each input line to the decoder.

In an alternative structure for decoder 8 a pre-decode level is added so that fewer distributed signals can change as the input lines 9 change values. In the pre-decode level the input lines 9 are split into groups that are processed by a first level of NAND gates. The outputs from those NAND gates pass to a second level of NAND gates whose outputs are inverted to drive the wordlines. Since only one of the lines that connect the two levels of NAND gates changes for each change in input values the maximum power consumption is less than for the structure of FIG. 2. Two levels of processing in the alternative structure make it relatively slow for small numbers of addresses, but for wider decoders (e.g. five or more addresses) it can be faster.

An alternative solution is to use a precharge decode structure. FIG. 3 illustrates precharge decode circuitry that represents an alternative structure for decoder 8. As before, inverted 11 and non-inverted 12 versions of each of the input lines 9 to the decoder are generated. A decode line 20 is provided for each workline. Each wordline is driven by an inverter 14 which receives the output from a two-input RAND gate 18. One of the inputs to the NAND gate 18 is a common timing enable signal at 19. The other of the inputs is from the respective decode line 20.

Each decode line can be taken high by a respective PMOS precharge transistor 21. The precharge transistors are is connected with their sources to a high voltage ($V_{DD}$) their drains to the respective decode line and their gates to a common precharge signal at 22. Each decode line can be taken low by any of a number of NMOS addressing transistors. The addressing transistors 23 are connected with their drains to the respective decode line, their sources to a low voltage (ground) and their gates to a selected one of the inverted and non-inverted input lines 11, 12. The inputs to the gates of the addressing transistors are arranged so that one addressing transistor of each decode line receives a selected inverted or non-inverted version of each of the input lines 9.

In use, to decode a set of signals applied to lines 9, a pulse is applied to the precharge line 22 so that the decode lines float at $V_{DD}$. Then the signals from the input lines 9 are applied to the addressing transistors 23. At all the decode lines corresponding to all the undesired wordlines at least one of the addressing transistors is turned on, so that those decode lines can all discharge to ground. At the decode line corresponding to the desired wordline none of the addressing transistors is turned on, so that decode tine continues to float at $V_{DD}$. After a delay that is sufficiently long for the voltages on all the undesired decode lines to have fallen, a signal is applied to the timing enable line 19. This causes the NAND gate 18 corresponding to the decode line that remains high to produce a low output, whereas all the other NAND gates produce high outputs. By virtue of the inverters 14 this causes the desired one of the wordlines to be selected.

The delay before application of the timing enable signal is crucial to the operation of the precharge circuit. The timing enable signal cannot be applied before all the undesired decode lines have discharged to below the input threshold voltage of the NAND gates 18, otherwise more than one wordline will be selected. Therefore, the delay is dependant on the speed with which the decode lines discharge. A decode tine with all of its addressing transistors turned on will discharge quickly but a decode line with only one of its addressing transistors turned on will discharge relatively slowly. The timing enable signal is usually derived from the arrangement shown at 24. Another instance of the decode structure is provided, this time with all but one of its addressing inputs connected to ground. The decode line 25 of the arrangement 24 therefore fails towards ground as slowly as any of the undesired decode lines can. The enable input to the NAND gate 26 of the arrangement 24 is held high. As soon as the decode line has fallen sufficiently the output 27 of the NAND gate goes high. The output 27 provides the timing enable signal at 19.

The precharge structure of FIG. 3 can be faster than the structures of FIG. 2. However, the discharge of all the undesired decode lines gives rise to high power consumption, and the necessary delay before the timing enable signal is generated reduces the speed of operation of the circuit. The choice between a static decoder (e.g. as shown in FIG. 2) and a precharge decoder is not clear-cut and very often both options have to be investigated when undertaking, a design.

It would be desirable to have a decoder circuit that allowed for faster decoding, preferably at reduced power consumption. In addition to providing a technically superior solution, such a circuit could save a considerable amount of investigatory design work.

SUMMARY OF THE INVENTION

According to the present invention there is provided a decode circuit for selecting one of a plurality of output lines in dependence on the status of a plurality at input lines, the circuit comprising: a first decode arrangement comprising: a first decode node; first precharging circuitry for charging the first decode node to a charging potential; first discharging circuitry comprising a plurality of switching means, each operable in dependence on the status of a respective one of the input lines to couple the first decode node to a discharging potential; and first selection circuitry coupled to a respective one of the output lines and operable in response to a first enable signal to select that output line if the first decode node has not discharged; and a second decode arrangement comprising: a second decode node; second precharging circuitry for charging the second decode node to a charging potential; second discharging circuitry comprising a plurality of switching means each operable in dependence on the status of a respective one of the input lines to couple the second decode node to a discharging potential; and second selection circuitry coupled to a respective one of the output lines and operable in response to a second enable signal to select that output line if the second discharge node has not discharged; wherein the first enable signal is derived from the potential of the second decode node.

Some preferred features of the first decode arrangement will now be described. Equivalent features are preferred to be present in the second decode arrangement, mutatis mutandis.

The first discharging circuitry preferably comprises a plurality of transistors having their drains connected to the first decode node, their sources connected to the discharging potential and their gates connected to receive a discharging signal dependant on the status of a respective one of the input lines. Each discharging signal suitably represents an inverted or non-inverted version of the respective one of the input lines.

The first precharge circuitry preferably comprises a precharge transistor having its source connected to the precharge potential and its drain connected to the decode node.

The first selection circuitry preferably comprises a selection transistor having its gate connected to the first decode node, its source connected to receive the first enable signal, and its drain arranged to provide a selection signal for the respective one of the output lines. There is suitably an inverter or other (e.g. non-inverting) drive means responsive to the selection signal to drive the respective one of the output lines. The first selection circuitry is suitably operable to select the respective one of the output lines by reducing the potential on the drain of the selection transistor, e.g. by drainage of that potential to the source of the selection transistor. There may be further precharge circuitry for precharging the gate of the selection transistor to a charging potential. The further precharge circuitry may comprise a further precharge transistor having its source connected to the precharge potential and its drain connected to the drain of the selection transistor, The said precharge transistor and the said further precharge transistor may be operable in response to a common precharge signal.

The second decode node may be connected directly to the source of the selection transistor.

The circuit may comprise a first holding transistor having its source connected to a charging potential, its drain connected to the decode node and its gate connected to the drain of the selection transistor. The circuit may comprise a second holding transistor having its source connected to a charging potential, its drain connected to the drain of the selection transistor and its gate connected to the decode node. The first and second holding transistors are preferably inverting (PMOS) transistors.

The second enable signal is suitably derived from the potential of the first decode node. Preferably the first decode node is connected to the source of an equivalent selection transistor of the second decode arrangement.

The first selection circuitry may be capable of selecting its respective output line in response to opposite values of the input lines than those in response to which the second selection circuitry is capable of selecting its respective output line.

Each output line may be or may be coupled to a wordline of a memory unit. The input lines suitably together represent an address, for selection. The input lines suitably convey binary state signals representing the said address.

The precharge potentials may be the same or different. The precharge potentials are preferably higher than the discharge potential (e.g. VDD and ground/0 V respectively) but the precharge potential could alternatively be lower than the discharge potential. It will be appreciated that for many implementations references to the source or drain of a transistor are arbitrary, and that any of the transistors referred to could be replaced by other switching means such as relays.

The decoder may be used for memory addressing or other applications such as decoding instruction codes.

BRIEF DESCRIPTION OF THE DRAWINGS

The present invention will now be described by way of example with reference to the accompanying drawings, in which.

DETAILED DESCRIPTION OF THE DRAWINGS

Figure 1:
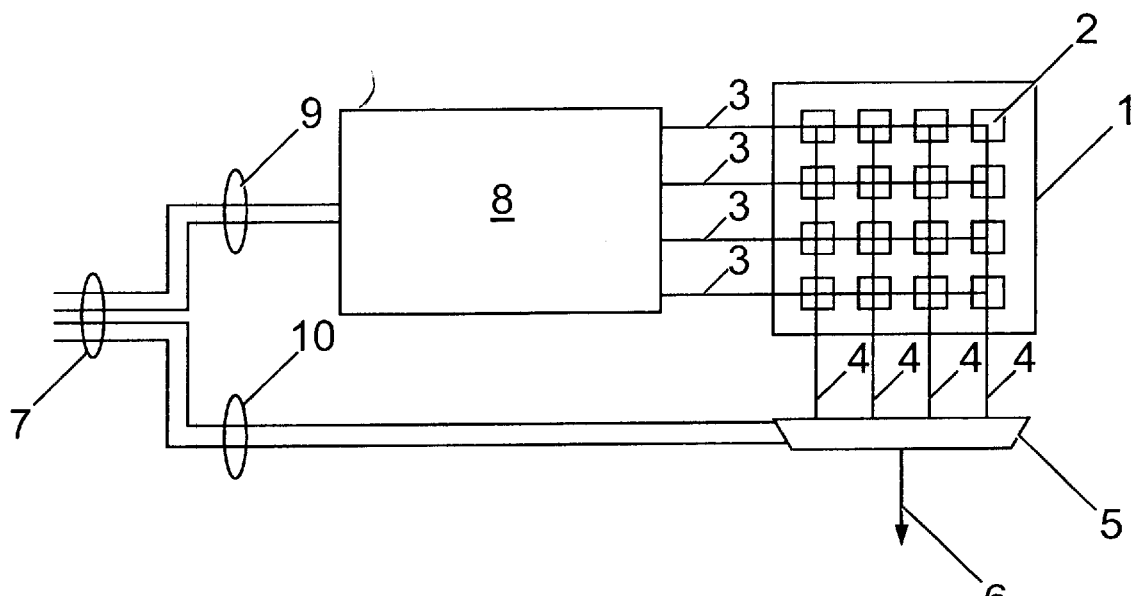
FIG. 1 shows a SRAM and its addressing circuitry.
Figure 2:
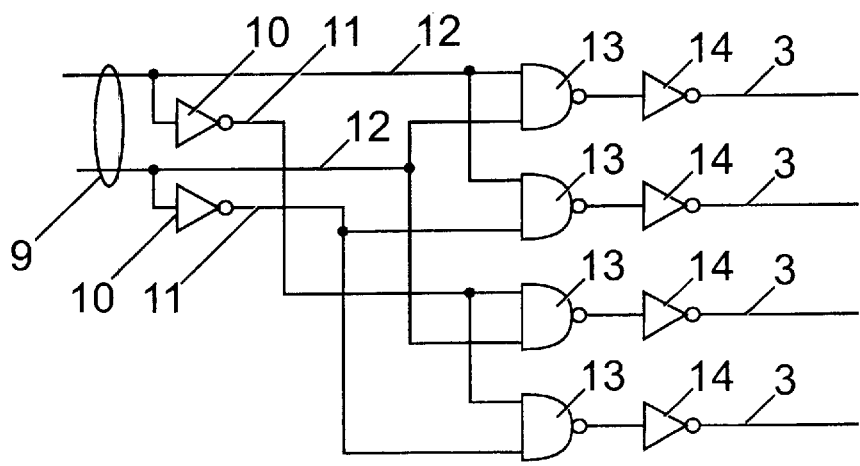
FIG. 2 shows a structure decoder 8.
Figure 3:
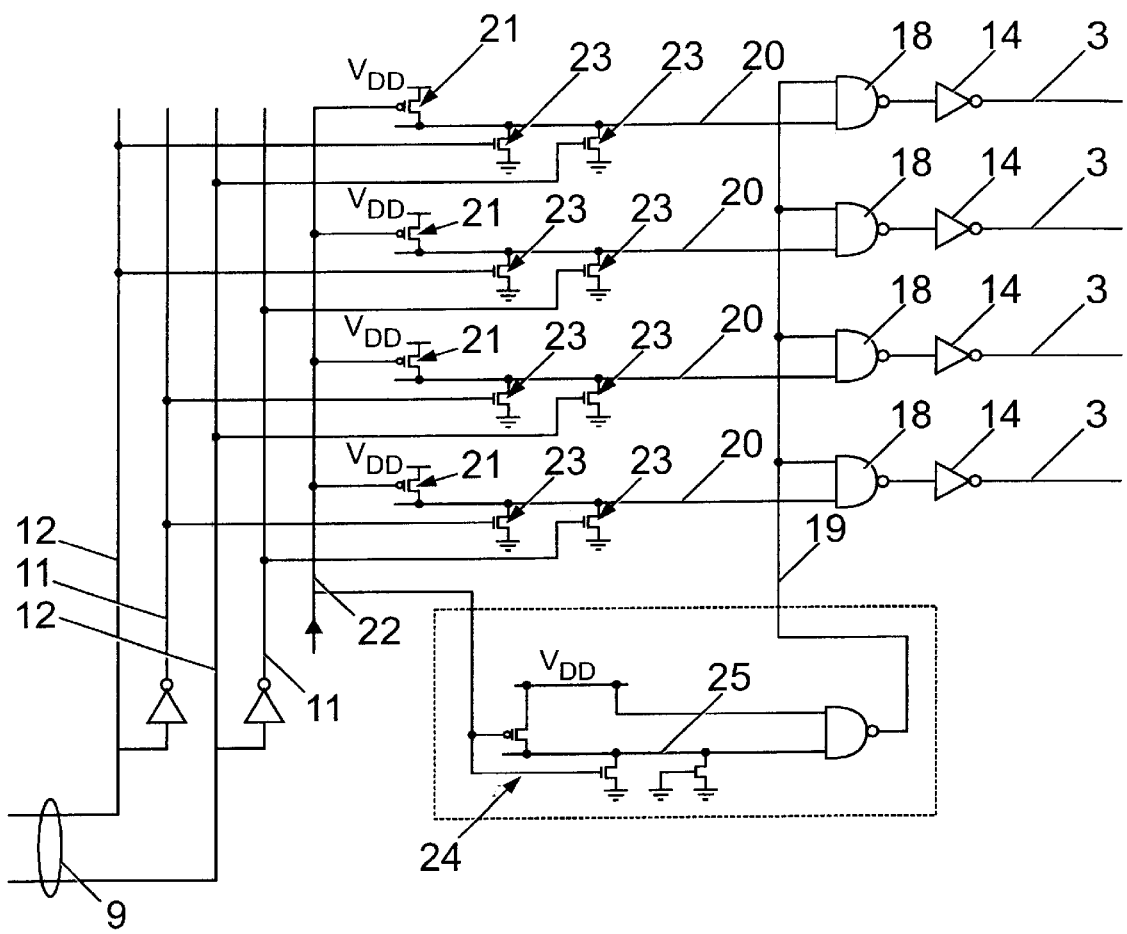
FIG. 3 shows a precharge structure E.
Figure 4:
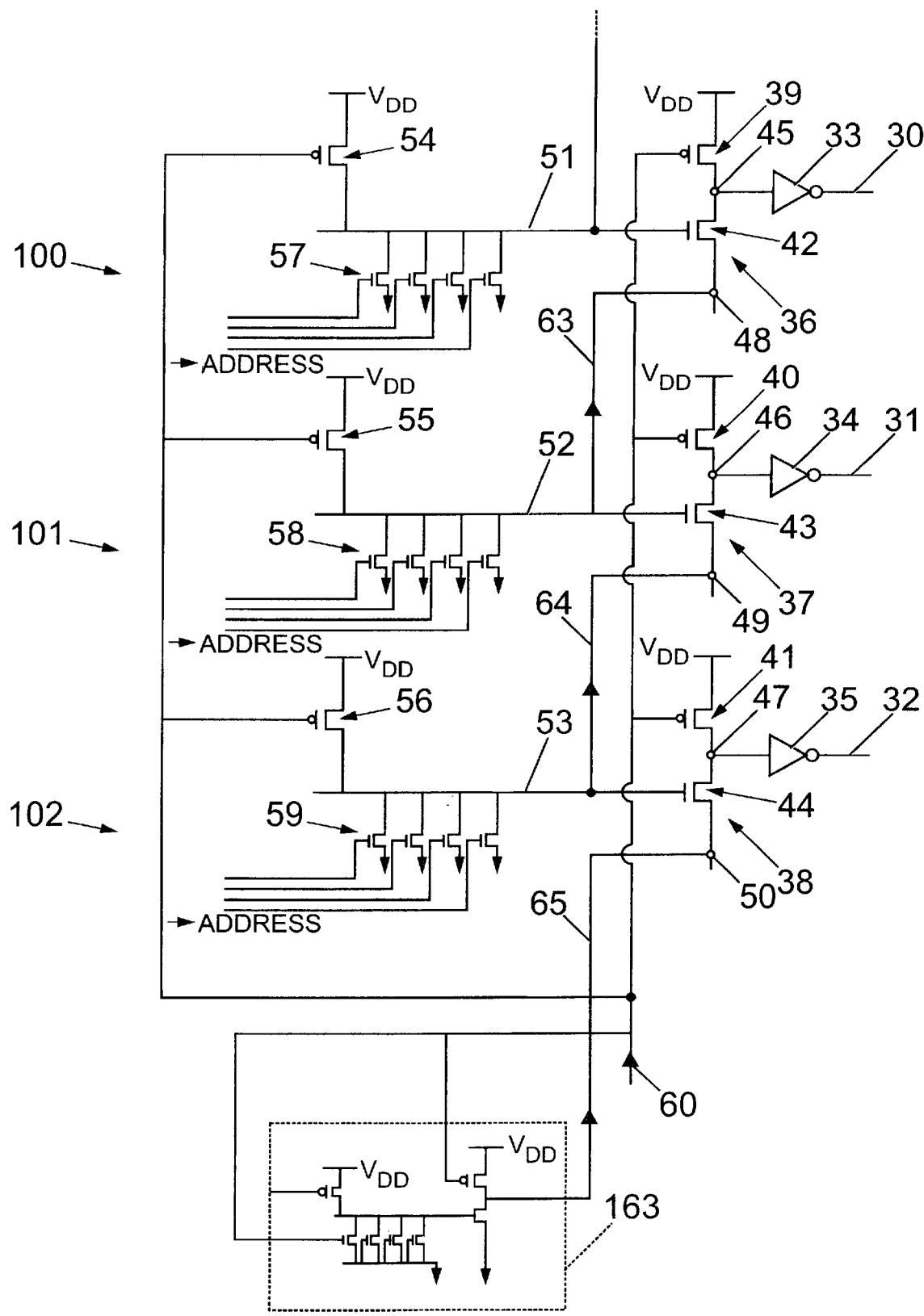
FIG. 4 shows precharge circuitry for three adjacent wordlines.
Figure 5:
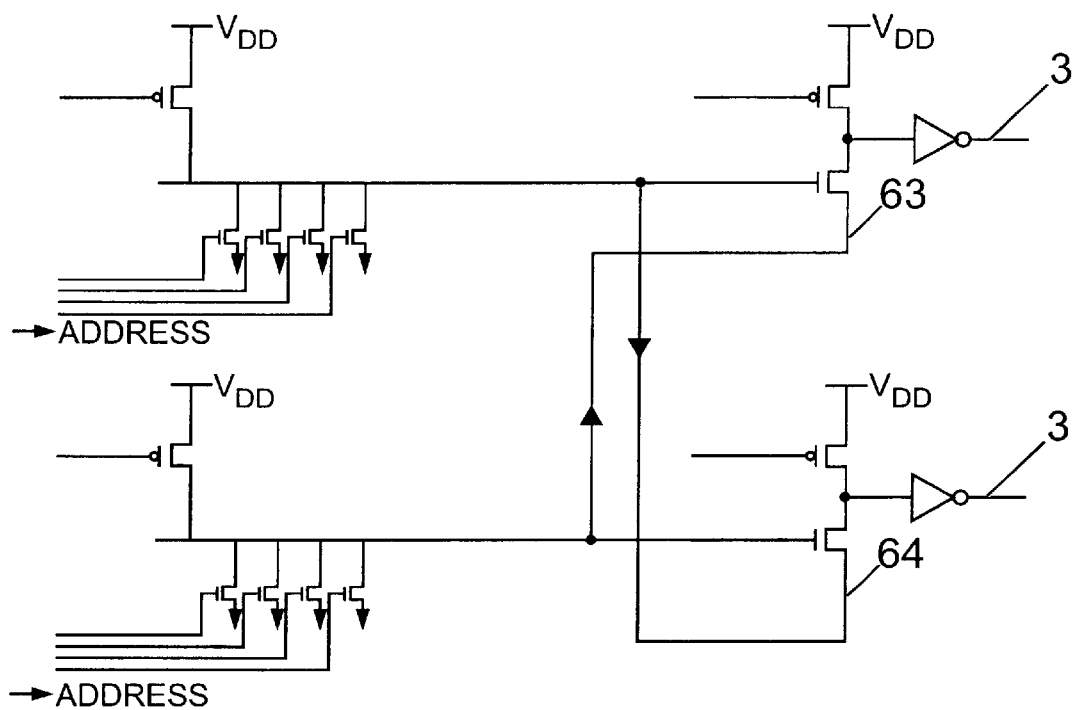
FIG. 5 shows alternative precharge circuitry for a pair of wordlines.
Figure 6:
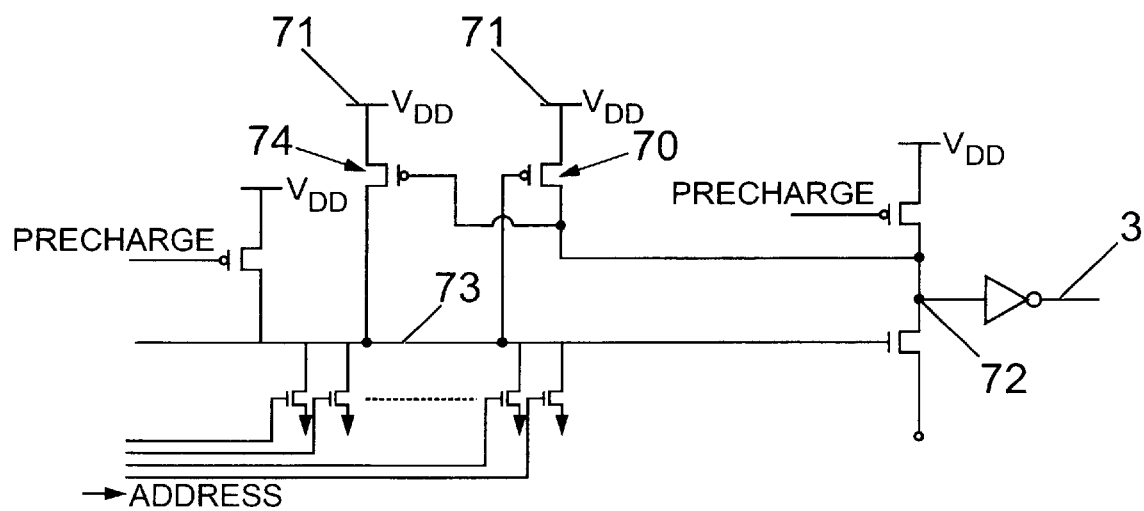
FIG. 6 shows another alternative precharge circuit for a single wordline.

The circuits of FIGS. 4 to 6 take advantage of the fact that in a precharge structure of the type shown in FIG. 3 all but one of the decode lines discharges. Therefore, the discharge lines adjacent to the desired decode tine (which does not discharge) will both discharge. In the circuits of FIGS. 4 to 6 the discharge of a decode line is used to derive a timing enable signal for another decode line.

In the circuit of FIG. 4 three decode arrangements 100–102 are shown, each corresponding to a single wordline of an SRAM memory. (In a real circuit one decode arrangement would be provided for each wordline of the SRAM memory for which the decoder acted). Three of the wordlines of the SRAM memory are shown at 30–32. Each wordline is driven through a respective inverter 33–35. The input to each inverter is generated by a respective gate arrangement 36–38 formed by two transistors 39–44. Each gate arrangement comprises a first PMOS precharge transistor 39–41 connected with its source to $V_{DD}$ and its drain to a respective wordline node 45–47, and an NMOS pass transistor 42–44 connected with its drain to the respective node 45–47 and its source to a respective enable node 48–50. The gate of each NMOS transistor 42–44 is connected to a respective decode line 51–53. Each decode line can be pulled up to $V_{DD}$ by a respective second PMOS precharge transistor 54–56 which is connected with its source to $V_{DD}$ and its drain to the respective decode line. Each decode line can be discharged to ground through any of a number of NMOS addressing transistors 57–59 which are connected with their sources to the respective discharge fine and their drains to ground.

The gates of the addressing transistors receive, as in the precharge circuit of FIG. 3, an inverted or non-inverted version of one of the address lines input to the decode circuitry. An inverted or non-inverted version of each of the address lines is applied to one of the address transistors so that each decode line will remain un-discharged only when the appropriate inputs are applied to the address lines, indicating that a cell or cells to which the corresponding wordline is connected is or are to be accessed.

All the first and second PMOS precharge transistors 39–41 and 54–56 receive a common precharge input 60.

In order to take advantage of the discharge of a decode line to enable the gate arrangement of another decode arrangement each decode line is connected, by a link as shown at 63–65 to the enable node of an adjacent decode arrangement.

A replica decode arrangement 163 having its decode tine connected to the enable node 50 of the first decode arrangement 102 of the chain is used to generate an enable input for that decode arrangement 102. One of the address transistors of the replica decode arrangement may be connected to a true (non-inverted) address line and another of its address transistors may be connected to the compliment (Inverse) of that address line, so that one of those transistors will be on when the system is being addressed.

PMOS address transistors could be used instead NMOS transistors, with opposite address values being applied to each one.

In use, to decode a set of signals applied to address lines to the decoder, a short low voltage pulse is applied to the precharge input 60 so that the decode lines 51–53 and the nodes 45–47 float at $V_{DD}$. The signals from the address lines (whether inverted or non-inverted) are applied to the addressing transistors 57–59 of all the decode arrangements. The precharge and address signals preferably, transit simultaneously, to save time and to avoid nodes floating. As each decode line except the one corresponding to the desired wordline discharges it draws the enable node of the adjacent decode arrangement's NAND gate low, allowing the wordline node of that adjacent decode arrangement to fall low if its own decode line is still sufficiently high to turn the decode arrangements pass transistor on. The desired decode line is the only one that will remain high, and the decode line connected to the enable node corresponding to that decode line will discharge. Therefore, the wordline node corresponding to that decode line is the only one that will fall low, causing its corresponding wordline to be driven high by its drive inverter.

The address signals to the gates of the address transistors and the precharge signals to the first and second precharge transistors are driven from d-type flip-flops so that the rising of the precharge and all the address signals is simultaneous. This can reduce the amount of through current required to drive the system, by ensuring that the precharge and address lines are not on together. When the addressing of the SRAM has been completed the flip-flops are reset, driving the address lines and the precharge lines low. This causes the decode lines to be precharged and the previously selected wordline to be driven low again, ready for the next memory access.

Instead of flip-flop circuits, the addressing and precharge signals could be gated with an enable signal applied to one input of a two-input AND operation (implemented by any suitable gate structure), the other input of which receives the precharge signal or a respective one of the addressing signals. The addressing signals would be gated before the inverted versions are generated. The timing of the enable signal should be such that it arrives just after the slowest address to arrive at the gates.

The links 63–65 between decode lines and enable nodes need not go between adjacent decode arrangements. However, configuring the links to go between adjacent decode arrangements makes the physical routing of the links easier, especially when the decoder is implemented on an integrated circuit.

FIG. 5 shows part of an especially preferred arrangement. In the system of FIG. 5 the decode arrangements are configured in pairs, with each decode line of a decode arrangement connected to the enable node of its pair. In this configuration the gate arrangement of the desired decode arrangement is enabled by means of the discharging of the decode line of its pair. This avoids the need for a replica decode arrangement to enable one of the true decode arrangements whilst maintaining the links 63–64 etc. passing only between adjacent decode arrangements.

It is particularly preferred that in the system of FIG. 5 the decode arrangements are paired so that the inputs to the addressing transistors of each pair are opposite. Each decode arrangement receives to one of its addressing transistors an input (either inverted or non-inverted) from each one of the address lines 9. When a decode arrangement is selected (so that none of its addressing transistors is turned on) the decode arrangement that discharges the fastest, and therefore provides the earliest and most strongly driven enable signal, is the one that has the opposite set of inputs from the address lines—i.e. It receives an inverted input from each input line from which the selected decode arrangement receives a non-inverted input, and a non-inverted input from each input line from which the selected decode arrangement receives an inverted input. Therefore, when all the addressing transistors of a decode arrangement are turned on, all the addressing transistors of its paired decode arrangement are turned off. When each decode arrangement is paired with its opposite in this way the selected decode arrangement is the first of all the decode arrangements to receive an enable signal, so the decoding speed is especially rapid. In some implementations the decoding scheme may be such that the decode arrangements cannot all be paired with their exact opposite. However, advantages can still be had if the pairings only partially make use of this concept.

A potential difficulty in implementing the arrangement of FIGS. 4 and 5 is that in some circumstances it might happen that one of the decode arrangements has only one of its addressing transistors turned on and therefore discharges relatively slowly, whereas at the decode arrangement that provides its enable input almost all of the addressing transistors are turned on. In this situation the slowly discharging decode arrangement might generate an erroneous output to drive a wordline. Whether this happens is dependent on many factors such as the parasitic capacitance on the decode lines and the characteristics of the transistors of the decode arrangements. Therefore, these should be designed carefully and preferably checked by simulation to ensure unwanted turn-on cannot occur. However, in practice unwanted turn-on is relatively unlikely to be a problem because of the body effect in the NMOS pass transistors.

The body effect causes the turn-on voltage of a transistor to be influenced by the voltage on the transistor's source. Generally, an n-channel MOSFET transistor has n+ regions forming the source and drain embedded in a p+ bulk Si body. A gate insulator region of dielectric $SiO_2$ lies between the source and drain over the channel of the transistor. A gate region is located over the dielectric. The sources and drains are isolated from the substrate (bulk) by the reverse biased p/n diodes implicit in the structure. Starting with all nodes at ground. If the voltage on the drain is raised to $V_{DD}$ no current will flow. If the voltage on the gate is now raised, negative charge (i.e. electrons) will be attracted to the opposite side of the gate dielectric in the channel. As the gate voltage rises, enough charge collects to allow current to flow between the source and the drain. This point is called inversion and the gate-source voltage at which this occurs is called the threshold voltage, $V_t$. As the gate voltage rises further, the charge builds and larger currents can flow. Eventually, the charge saturates and the increase in current with gate voltage also saturates. If a negative voltage is applied to the bulk, this increases the gate-to-source voltage necessary to generate inversion in the channel, effectively raising the threshold voltage, $V_t$. In normal digital circuits for NMOS transistors, the substrate is uniformly connected to ground, 0 V. So effects of negative substrates are not seen. However, raising the source voltage above 0 V is effectively the same as reducing the substrate voltage below 0 V, a configuration that is often used. So transistors with their sources at voltages greater than 0 V have larger $V_t$s than equivalent transistors with their sources at 0 V i.e. the gate-source voltage required to enable current to flow from drain to source is larger.

The NMOS pass transistors of the arrangement of FIGS. 4 and 5 are source connected with their drains at $V_{DD}$ (at the wordline node) giving them a relatively high $V_t$ due to the body effect. Therefore, in order for a pass transistor to start conducting, the decode line on its source must reach a body-effect-inflated $V_{tn}$ below the slower decode line on its gate. This reduces the chance of an unwanted turn-on.

Another way to reduce the chance of unwanted turn-on is to pair the decoders with some decoding bits the same, to reduce the slew rate of the decode lines under these circumstances. This would reduce the speed of selection, however.

FIG. 6 illustrates some additional modifications that can be made to the precharge circuitry of FIGS. 4 and 5. In order to function, the circuitry of FIGS. 4 and 5 relies on charge storage on the decode line in the selected decoder and on the wordline node in the non-selected decoders. In noisy circuit environments charge storage can be compromised and therefore modifications can be made for reliability reasons.

In FIG. 6 a PMOS transistor 70 is connected with its source to $V_{DD}$ 71, and its drain to the workline node 72. The gate of transistor 70 is connected to the decode line 73. Transistor 70 acts to keep the wordline node 72 at $V_{DD}$ when the decode line is discharged in non-selected decoders.

Another PMOS transistor 74 is connected with its source to $V_{DD}$ 71, and its drain to the decode line 73. The gate of transistor 74 is connected to the wordline node 72. Transistor 74 acts to resist discharging of the decode line in the selected decoders.

Transistors 70 and 74 form a cross-coupled pair between the decode line and the wordline node. The transistors also help avoid problems due to inadvertent discharge of the wordline node, as described previously. Once the decode line is below ($V_{DD}$-$V_{tp}$), the transistor 70 holds the wordline node high against any discharge current through the pass transistor until the decode line has had a chance to discharge and turn it off completely. Either, both or neither of transistors 70 and 74 may be used.

Another way of resisting discharge of the wordline node is to have a feedback PMOS transistor connected with its source to $V_{DD}$, its drain to the wordline node arid its gate to the wordline itself. However, this device would have to be over-ridden by the enable signal via the NMOS pass transistor 75 when the wordline is selected, which would use more power than the alternative arrangements and slow selection of the wordline down slightly.

The power consumption of the circuit can be reduced by a number of other measures, including careful design and layout of the circuit—e.g. keeping the decode line as short a possible and by designing the NMOS decode transistors to share drains.

In comparison to prior art circuits, the circuits of FIGS. 4 to 6 allow for fast decoding, since unlike in a standard precharge circuit no time is wasted waiting for an enable signal to arrive, unlike in a standard static decoder there are only three inversion stages (assuming there is an inverter driver at the output of the address flip-flop) from address to wordline. In comparison to a standard precharge circuit speed is also gained by the fact that the enable signal to the selected decode arrangement can be provided by a decoder with all its decoder NMOS transistors on, whereas a standard precharge timing circuit is limited in speed by the worst case of just one decoder transistor turning on to effect worst case operation. Similarly, the need for separate timing enable generation circuitry can be avoided. It is relatively easy to scale the circuits of FIGS. 4 to 6 by adding/removing address inputs with their associated NMOS addressing transistors to/from the decode line, whereas in a standard static circuit changing the address size can often be difficult since the number of inputs directly changes the type of gates needed—often complete redesigns are necessary when addresses are added/removed to achieve optimum performance. The circuits of FIGS. 4 to 6 also allow for especially compact layouts; the NMOS addressing transistors could sit in the layout below the address lines, and the remaining circuitry (possibly just 7 transistors) can be laid out in a small area since all devices but the driver inverter can be very small.

The circuits of FIGS. 4 to 6 may be used in decoders for SRAM and other memory arrays, and in other decoding situations such as dedicated processing arrangements.

The applicant draws attention to the fact that the present invention may include any feature or combination of features disclosed herein either implicitly or explicitly or any generalization thereof, without limitation to the scope of any of the present claims. In view of the foregoing description it will be evident to a person skilled in the art that various modifications may be made within the scope of the invention.

What is claimed is:

1. A decode circuit for selecting one of a plurality of output lines in dependence on the status of a plurality of input lines, the circuit comprising:
   a first decode node;
   first precharging circuitry for charging the first decode node to a charging potential;
   first discharging circuitry comprising a plurality of first switching means each operable in dependence on the status of a respective one of the input lines to couple the first decode node to a discharging potential, wherein each of the first switching means connected to a different one of the plurality of input lines; and
   first selection circuitry coupled to a respective one of the output lines and operable in response to a first enable signal to select that output line if the first decode node has not discharged; and
   a second decode arrangement comprising:
      a second decode node;
      second precharging circuitry for charging the second decode node to a charging potential;
      second discharging circuitry comprising a plurality of second switching means each operable in dependence on the status of a respective one of the input lines to couple the second decode node to a discharging potential, wherein each of the second switching means connected to a different one of the plurality of input lines; and
      second selection circuitry coupled to a respective one of the output lines and operable in response to a second enable signal to select that output line if the second discharge node has not discharged;
   wherein the first enable signal is derived from the potential of the second decode node.

2. A decode circuit as claimed in claim 1, wherein the first discharging circuitry comprises a plurality of transistors having their drains connected to the first decode node, their sources connected to the discharging potential and their gates connected to receive a discharging signal dependant on the status of a respective one of the input lines.

3. A decode circuit as claimed in claim 2, wherein each discharging signal represents an inverted or non-inverted version of the respective one of the input lines.

4. A decode circuit as claimed in claims 1,2 or 3, wherein the first precharge circuitry comprises a precharge transistor having its source connected to the precharge potential and its drain connected to the decode node.

5. A decode circuit, for selecting one of a plurality of output lines in dependence on the status of a plurality of input lines, the circuit comprising:
   a first decode arrangement comprising:
   a first decode node;
   first precharging circuitry for charging the first decode node to a charging potential;
   first discharging circuitry comprising a plurality of first switching means, each operable in dependence on the status of a respective one of the input lines to couple the first decode node to a discharging potential; and
   first selection circuitry coupled to a respective one of the output lines and operable in response to a first enable signal to select that output line if the first decode node has not discharged; and
   a second decode arrangement comprising:
      a second decode node;
      second precharging circuitry for charging the second decode node to a charging potential;
      second discharging circuitry comprising a plurality of second switching means, each operable in dependence on the status of a respective one of the input lines to couple the second decode node to a discharging potential; and
      second selection circuitry coupled to a respective one of the output lines and operable in response to a second enable signal to select that output line if the second discharge node has not discharged;
   wherein the first enable signal is derived from the potential of the second decode node and the first selection circuitry comprises a selection transistor having its gate connected to the first decode node, its source connected to receive the first enable signal, and its drain arranged to provide a selection signal for the respective one of the output lines.

6. A decode circuit as claimed in claim 5, further comprising:
   an inverter responsive to the selection signal to drive the respective one of the output lines.

7. A decode circuit as claimed in claim 6, wherein the first selection circuitry is operable to select the respective one of the output lines by reducing the potential on the drain of the selection transistor.

8. A decode circuit as claimed in claims 5, 6 or 7, further comprising: precharge circuitry for precharging the drain of the selection transistor to a charging potential.

9. A decode circuit as claimed in claim 8, wherein the further precharge circuitry comprises a further precharge transistor having its source connected to the precharge potential and its drain connected to the drain of the selection transistor.

10. A decode circuit as claimed in claim 9, wherein the first precharge circuitry comprises a precharge transistor having its source connected to the precharge potential and its drain connected to the decode node, and the precharge transistor and the further precharge transistor are operable in response to a common precharge signal.

11. A decode circuit as claimed in claims 5, 6, or 7, wherein the second decode node is connected to the source of the selection transistor.

12. A decode circuit as claimed in claim 5, further comprising a first holding transistor having its source connected to a charging potential, its drain connected to the decode node and its gate connected to the drain of the selection transistor.

13. A decode circuit as claimed in claim 12, comprising a second holding transistor having its drain connected to a charging potential, its drain connected the drain of the selection transistor and its gate connected to the decode node.

14. A decode circuit as claimed in claim 1, wherein the second enable signal is derived from the potential of the first decode node.

15. A decode circuit as claimed in claim 1, wherein the first selection circuitry is capable of selecting its respective output line in response to opposite values of the input lines than in response to which the second selection circuitry is capable of selecting its respective output line.

16. A decode circuit as claimed in claim 1, wherein each output line is a wordline of a memory unit.

17. A decode circuit as claimed in claim 1, wherein the input lines represent an address for selection.

* * * * *

UNITED STATES PATENT AND TRADEMARK OFFICE
CERTIFICATE OF CORRECTION

PATENT NO.    : 6,456,118 B2
DATED         : September 24, 2002
INVENTOR(S)   : Robert Beat It is certified that error appears in the above-identified patent and that said Letters Patent is hereby corrected as shown below:

<u>Title page,</u>
Please add:
-- [30]  Foreign Application Priority Data
         Jan. 13, 2000 (UK)……………………..00007385 --.

Signed and Sealed this

Seventeenth Day of June, 2003

JAMES E. ROGAN
*Director of the United States Patent and Trademark Office*